United States Patent [19]
Chevallier et al.

[11] Patent Number: 6,115,546
[45] Date of Patent: Sep. 5, 2000

[54] APPARATUS AND METHOD FOR MANAGEMENT OF INTEGRATED CIRCUIT LAYOUT VERIFICATION PROCESSES

[75] Inventors: Christophe J. Chevallier, Palo Alto; Yarema A. Hryciw, San Jose, both of Calif.

[73] Assignee: Micron Technology, Inc., Boise, Id.

[21] Appl. No.: 09/120,788

[22] Filed: Jul. 22, 1998

Related U.S. Application Data

[63] Continuation of application No. 08/640,105, Apr. 30, 1996, Pat. No. 5,787,006.

[51] Int. Cl.[7] .................................................. G06F 17/50
[52] U.S. Cl. ............................... 395/500.06; 395/500.02
[58] Field of Search .................................... 364/488, 480, 364/490, 491, 578, 468.01, 468.28; 395/500.06, 500.02

[56] References Cited

U.S. PATENT DOCUMENTS

| | | | |
|---|---|---|---|
| 5,050,091 | 9/1991 | Rubin | 364/488 |
| 5,220,512 | 6/1993 | Watkins et al. | 364/489 |
| 5,301,318 | 4/1994 | Mittal | 395/600 |
| 5,463,563 | 10/1995 | Bair et al. | 364/490 |
| 5,475,695 | 12/1995 | Caywood et al. | 371/27 |
| 5,526,517 | 6/1996 | Jones et al. | 395/600 |
| 5,528,508 | 6/1996 | Russell et al. | 364/488 |
| 5,590,046 | 12/1996 | Ardra | 364/489 |
| 5,623,418 | 4/1997 | Rostoker et al. | 364/489 |
| 5,787,006 | 7/1998 | Chevallier et al. | 364/488 |

*Primary Examiner*—Kevin J. Teska
*Assistant Examiner*—Leigh Marie Garbowski
*Attorney, Agent, or Firm*—Schwegman, Lundberg, Woessner & Kluth P.A.

[57] ABSTRACT

An apparatus and method for managing data obtained during the Design Rule Check (DRC) and Layout versus Schematic (LVS) verification procedures executed during the design of an integrated circuit. The apparatus is a data processing system which includes a database containing information regarding the schematics and layouts of the cells of an integrated circuit. The system accesses the database upon the completion of a DRC or LVS operation and queries the user as to whether the cell should be marked as successfully passing the appropriate verification procedure. A user is also able to access a report generating module to inspect the verification status of a cell in the IC design and generate a report showing the status of the verification procedures for each cell, organized according to one of several criteria.

32 Claims, 5 Drawing Sheets

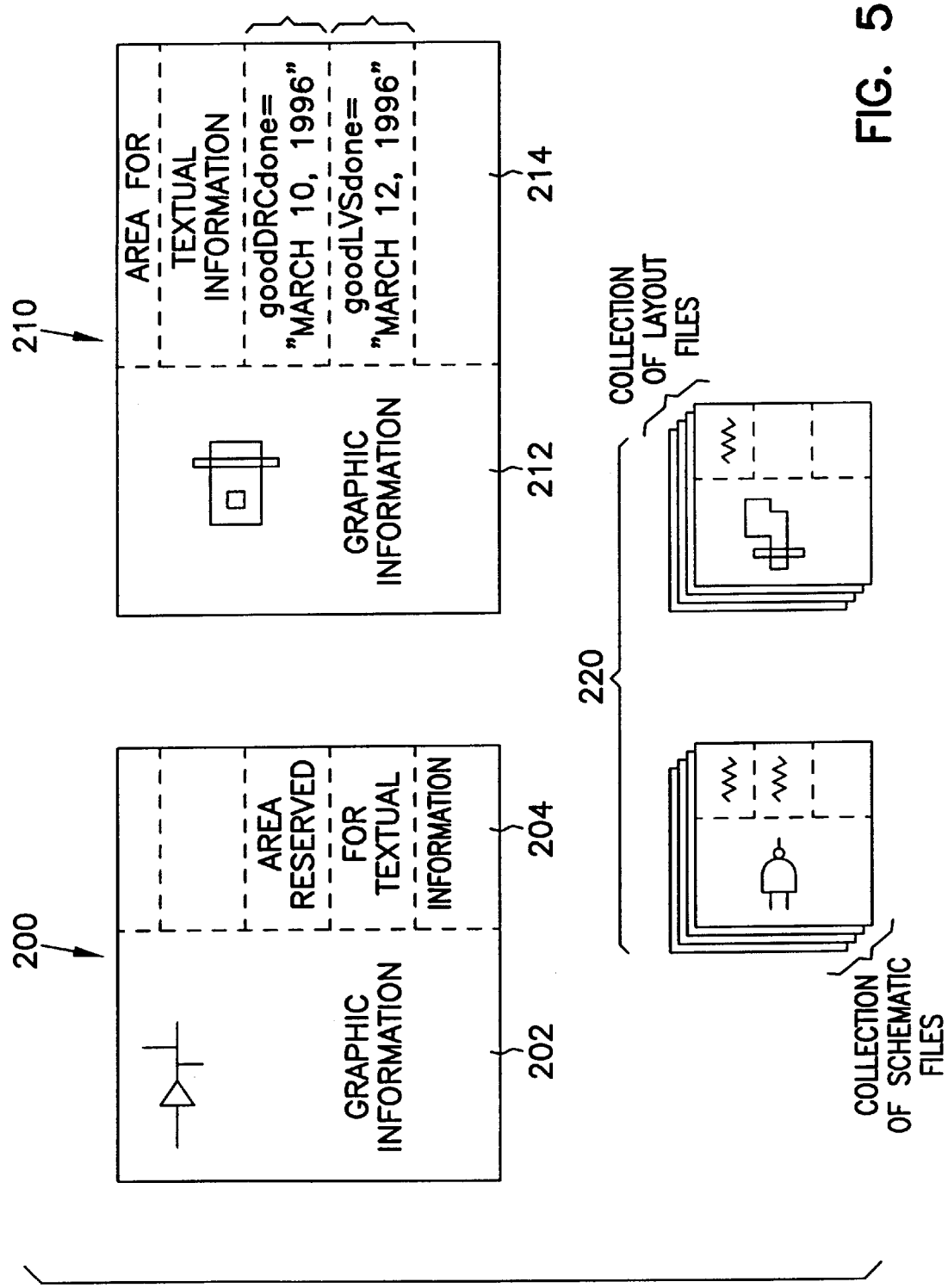

Apr 11 17:08                                                  report

| CELLNAME | SCHEMATIC LAST CHANGE | LAYOUT LAST CHANGE | *LAYOUT NEEDING UPDATE | GOOD DRC DONE | *LAYOUT NEEDING DRC | GOOD LVS DONE | *LAYOUT NEEDING LVS |
|---|---|---|---|---|---|---|---|
| 4moutdriver | Nov 27 17:46:22 1995 | | | | | | * |
| BXEN1 | Nov 28 17:35:22 1995 | | | | | | * |
| BYEN2 | Nov 27 17:46:37 1995 | | | | | | * |
| DataLatch | Nov 28 17:33:01 1995 | Nov 28 17:23:32 1995 | * | ? | * | ? | * |
| PLAand | Feb 16 15:55:09 1996 | Feb 16 15:33:22 1996 | * | ? | * | ? | * |
| RWcntr1 | Feb 16 15:57:17 1996 | Feb 16 16:38:16 1996 | | Feb 16 15:25:32 1996 | * | Feb 16 16:40:16 1996 | |
| VPMUX | Feb 15 13:29:56 1996 | Feb 15 14:34:38 1996 | | Feb 15 14:35:38 1996 | * | ? | * |
| VswRef0 | Feb 13 10:23:52 1996 | Feb 13 13:20:13 1996 | | Feb 12 16:04:02 1996 | | ? | * |
| VswtchRef | Feb 13 10:25:12 1996 | Feb 13 10:37:42 1996 | | Feb 13 11:37:42 1996 | * | ? | * |
| array4MLVS | Feb 17 09:47:12 1996 | Feb 17 09:38:58 1996 | * | ? | * | ? | |
| arrayCtr | Nov 28 17:33:08 1995 | Nov 28 18:43:13 1995 | | Sep 28 13:16:02 1995 | * | ? | * |
| del_trail | Nov 28 18:05:07 1995 | Nov 10 16:51:09 1995 | * | | * | ? | * |
| jkff | Nov 28 18:04:47 1995 | Nov 8 14:54:54 1995 | * | | * | ? | * |
| outdriver | Dec 14 08:48:11 1995 | Dec 14 09:25:15 1995 | * | | * | ? | * |
| sghvcomp | Nov 28 18:08:28 1995 | Nov 14 16:47:00 1995 | | | * | ? | * |
| tt1bufS | Dec 8 14:42:29 1995 | Dec 8 14:49:43 1995 | | | * | ? | * |

FIG. 6

APPARATUS AND METHOD FOR MANAGEMENT OF INTEGRATED CIRCUIT LAYOUT VERIFICATION PROCESSES

This application is a continuation of U.S. patent application Ser. No. 08/640,105, filed Apr. 30, 1996 now U.S. Pat. No. 5,787,006 on Jul. 28, 1998.

TECHNICAL FIELD

The present invention is directed to the design and fabrication of integrated circuits, and more specifically, to an apparatus and method for managing the design rule and layout versus schematic verification procedures used when producing such circuits.

BACKGROUND OF THE INVENTION

The design of an integrated circuit (IC) typically includes the production of a schematic representation showing the circuit elements (termed cells) for each functional unit of the IC and the interconnections between the elements. The schematic is translated into a physical layout which is a geometric representation of the circuit composed of polygons and interconnecting paths. The layout specifies the position and relative dimensions of the layers of materials which are deposited on a silicon wafer to form the circuit elements and interconnections.

A layout for an integrated circuit typically contains a multitude of cells, with each cell or group of cells corresponding to a circuit element having a defined function (e.g., a logic gate, a multiplier, a memory cell, etc.). If the schematic for a cell is changed during the design process, then the layout for that cell must be modified to reflect the new design. "Layout versus Schematic" (LVS) verification is a procedure by which the schematic of the cell is compared to the layout to be certain that the layout properly corresponds to the functionality of the schematic. This is typically done by comparing a netlist derived form the schematic with one derived from the layout.

In addition to maintaining the proper correspondence between a schematic and the physical layout, it is also necessary that the integrated circuit design be consistent with the technology, equipment, and capabilities of the fabrication process. "Design Rule Checking" (DRC) is a process by which the layout is checked to make certain that the layout does not violate any of the geometrical relationships dictated by electrical rules and the fabrication process (metal-to-metal spacing, minimum feature width, etc.). Typically, DRC is carried out by applying DRC rules (as defined by the fabrication foundry) to a DRC program which is run on the layout database files.

During the process of designing the integrated circuit, the schematic for a cell may be changed many times. Each time the schematic is changed, the layout is also changed to reflect the new schematic. Thus, each change in a cell's schematic requires a new layout and a LVS verification. Similarly, each change in the layout (as a result of a schematic change or a change in the fabrication process) requires a DRC procedure to verify the correctness of the new layout. An IC may contain hundreds of cells, with cells being redesigned concurrently. Thus, the LVS and DRC verification procedures will be executed many times, and tracking the design stage and verification status of each cell design is an important task which can reduce the overall design time.

An alternate approach is to run the DRC and LVS procedures at the end of the overall design process. This is generally not desirable because DRC and LVS errors discovered at that time will have affected the entire design and are more difficult to fix at that point. This approach would end up requiring more time overall to implement.

Presently, information regarding the verification status of an IC design can be tabulated by hand. The disadvantage of determining the status by this method is that preparing a verification status report by hand is a slow and unreliable task. At the other extreme, while a purely automated system would speed up the process, it would not be capable of recognizing an error or inconsistency in the DRC or LVS verification processes.

What is desired is an apparatus and method for managing the tracking of the results of the DRC and LVS verification procedures used in designing an integrated circuit which is faster and more reliable than the methods currently used in the semiconductor industry.

SUMMARY OF THE INVENTION

The present invention is directed to an apparatus and method for managing the data obtained during the DRC and LVS verification procedures executed during the design of an integrated circuit. The apparatus takes the form of a data processing system which includes a database containing information regarding the schematics and layouts of the cells of an integrated circuit. The data processing system accesses the database upon the completion of a Design Rule Check (DRC) operation which is performed on a cell. A user is then queried as to whether the designated cell should be marked as successfully passing the verification procedure by having the cell's layout file updated to reflect the current date and time. Similarly, upon completion of a Layout versus Schematic (LVS) operation, a user is queried as to whether the cell should be marked as successfully passing the verification procedure by having the cell's layout file updated to reflect the current date and time.

This approach allows the user to examine the results of the completed verification processes and apply a desired set of criteria in evaluating whether to update the layout file. In addition to having the layout file updated based on user determined criteria, the present invention may be operated in a mode in which the layout file is automatically updated upon completion of a DRC or LVS verification process in which no errors are found.

A cell's layout file may not be a single data file, but instead can consist of a set of linked files which relate to the cell and contain the data. These linked files might include, for example, a file containing graphical layout data and a file containing textual information and verification status updates relating to the layout.

In addition, a layout for a cell may contain references to other layouts, thus creating a hierarchical tree of layouts. This would correspond to the situation in which a cell contained other cells. In such a case, when a DRC verification process is executed for a particular cell, the DRC program may access and check not only the designated cell, but also each cell lower in the hierarchy. When the layout file for the designated cell is updated to reflect completion of the DRC process, the layout file of each linked layout file in the hierarchy below it can also be accessed and updated.

After the DRC and LVS files for the designated cell (and if desired by the user, for all related cells in its hierarchy) have been updated, or at any time during the design process, a user can access a report generating module of the present invention to inspect the verification status of a cell in the IC design. For each cell selected, the schematic database is accessed and the latest modification data is noted. The layout database is then accessed and the latest modification date, latest updated DRC procedure, and latest updated LVS procedure dates are noted. The invention then determines the amount of time that has elapsed between the layout modification date and the schematic modification date, the layout modification date and the updated DRC date, and the layout modification date and the updated LVS date. The invention then sorts the data and generates a report showing the status of the verification procedures for each cell, organized according to one of several criteria. This permits a project manager to identify project priorities based on the time differences between the various verification procedures performed on a cell.

The apparatus and method of the present invention can be applied to the design of a board-level system as well as to integrated circuits. This is because the process of printed circuit board layout is performed with many of the same tools and methods as those used for integrated circuit design.

Further objects and advantages of the present invention will become apparent from the following detailed description and accompanying drawings.

BRIEF DESCRIPTION OF THE DRAWINGS

FIG. 5 illustrates the contents of the database containing the schematic design and layout design data files, and the verification tracking data appended by the present invention.

FIG. 6 is an example of a report generated by the integrated circuit layout verification data management apparatus of the present invention.

DETAILED DESCRIPTION OF THE INVENTION

Figure 1:
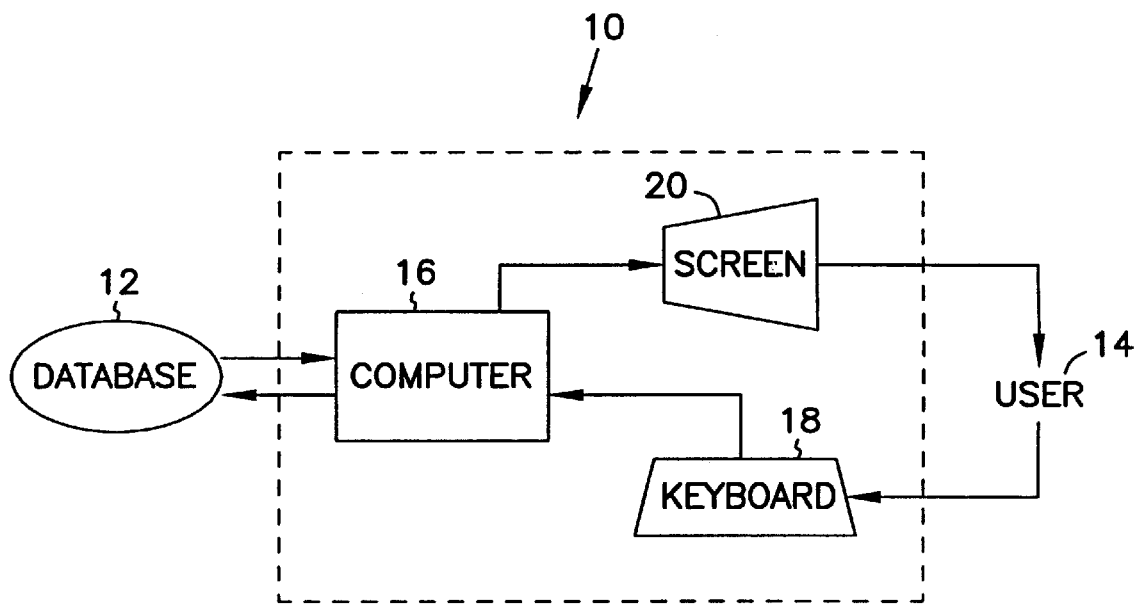
FIG. 1 shows the functional components of a data processing system which enables a user to access the schematic design and layout design database files generated during the design of an integrated circuit.

FIG. 1 shows the functional components of a data processing system 10 which enables a user 14 to access the schematic design and layout design database files 12 generated during the design of an integrated circuit. Data processing system 10 includes a computer 16 or other data processing device which is capable of accessing data files contained in database 12 in response to commands entered by means of a data input device, such as keyboard 18. Computer 16 causes the requested data file to be displayed on monitor or screen 20 in response to the entered command(s).

Database 12 contains graphic and textual information contained in the form of data files. One section of the database contains data files showing the schematics of each of the cells needed for a particular integrated circuit design. A second section of the database (or a second database) contains data files showing the layout designs which correspond to each of the schematics. Textual information in the form of schematic and/or layout design modification dates and verification dates (of DRC and LVS verifications) are also stored in the appropriate sections of the database(s), in the same files as the graphical information, or in files linked to those files. The layout modification dates are only updated if the layout is modified. A layout modification date cannot be changed as a result of a DRC or LVS process.

Figure 2:
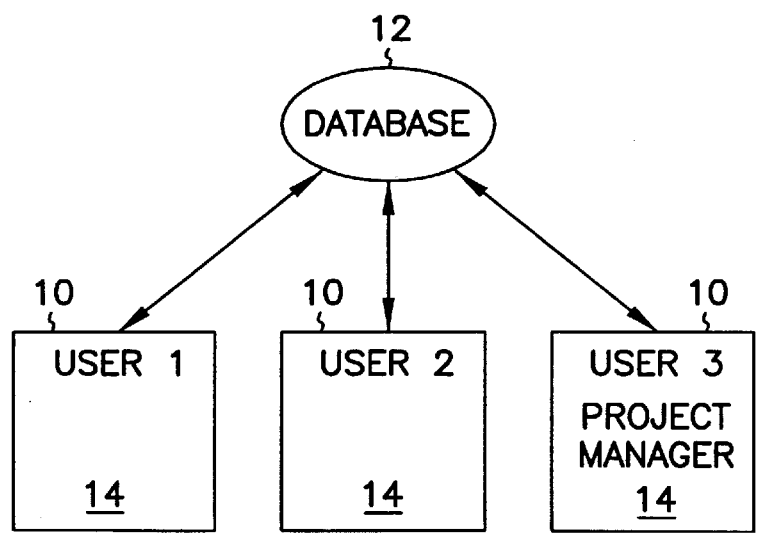
FIG. 2 shows how the schematic design and layout design database files may be accessed by multiple users during a design project using a data processing system of the type shown in FIG. 1.

FIG. 2 shows how the schematic design and layout design files contained in database 12 may be accessed by multiple users during a design project using a data processing system 10 of the type shown in FIG. 1. In FIG. 2, a total of three users 14 are shown accessing the files of database 12 using the components of system 10. In a typical design environment, user 1 and user 2 would be a circuit designer (responsible for designing the schematic) or layout designer, while user 3 would be the manager for the integrated circuit development project.

Figure 3:
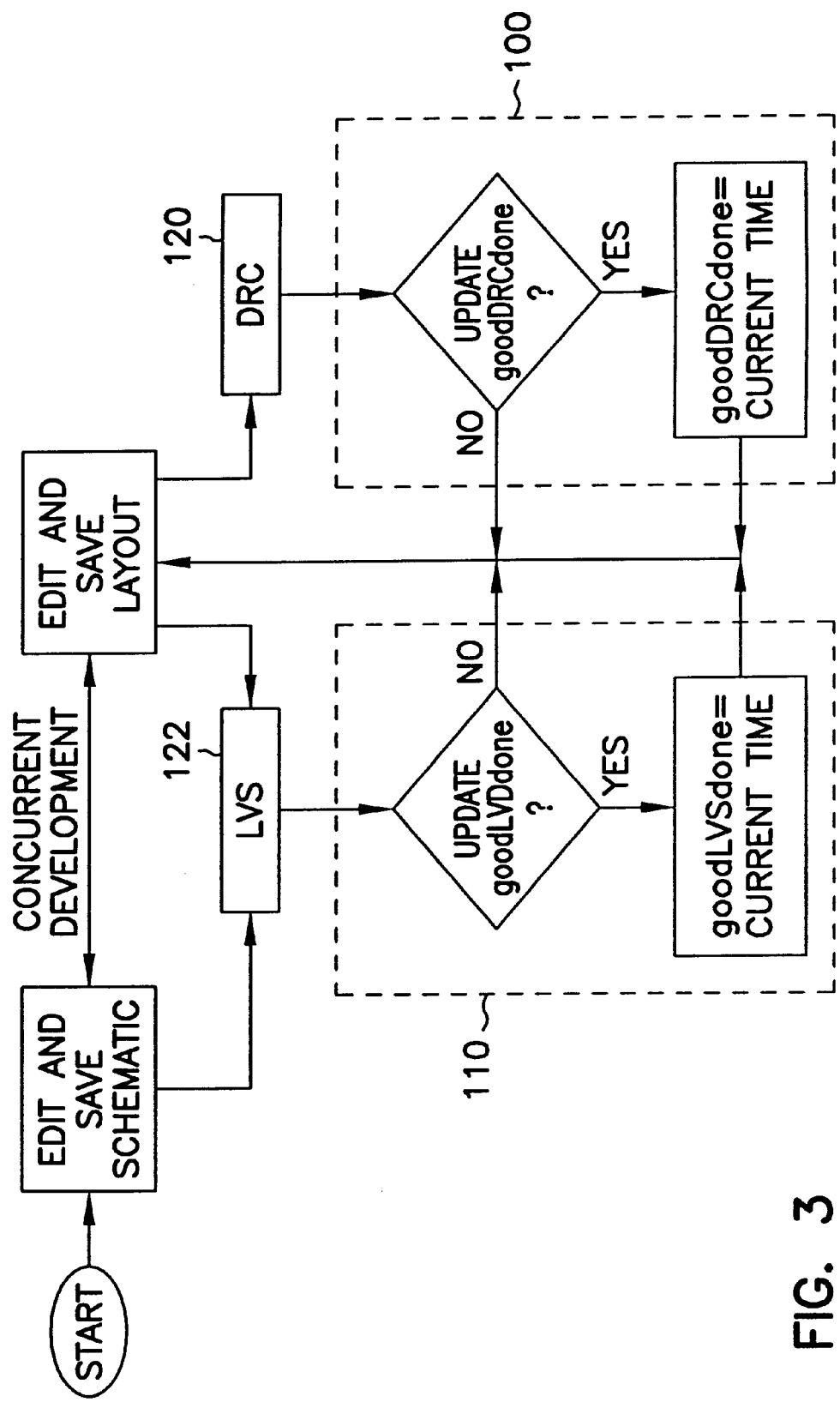
FIG. 3 is a flowchart showing the DRC and LVS verification update steps of the integrated circuit verification data management method of the present invention.

FIG. 3 is a flowchart showing the DRC 100 and LVS 110 verification update steps of the integrated circuit verification management method of the present invention. As indicated by the figure, the schematic for a cell and the layout design are developed concurrently. This is because there are typically hundreds of cells in an integrated circuit design and the schematics and layouts for the cells are in various stages of completion. In addition, the schematic is often redesigned during the process, necessitating a new version of the layout design.

The current schematic and layout for all of the cells in the integrated circuit are stored in the appropriate sections of the database. As noted, they may also be stored in separate databases as well, with one database containing the schematics and another the layouts. Note that a layout for a particular cell may contain a reference to a layout file for another cell which is contained within the design of the designated cell. This serves to form a linked set or hierarchical tree of related layout cells. The present invention may be used to update just the layout data file of the designated cell, or may be used to update the layout files of the designated cell and all other cells beneath the designated cell in the hierarchy.

A vendor supplied program is typically used to apply the appropriate manufacturing rules to the cell layouts contained in the layout database. This serves to execute the design rule checking (DRC) 120 function. A second program performs the layout versus schematic (LVS) function 122 by comparing the function of the layout design for a cell to the schematic for that cell.

Both the DRC 120 and LVS 122 routines are typically embedded in a standard Electronic Design Automation (EDA) environment. The EDA environment is a commercially available framework which includes end user level capabilities to read and write to the schematic and layout database files. This allows retrieval of cell names, representation data, and date of last change for the design of each cell. In addition, most commercial EDA packages include an end user accessible procedural language which can be used to write programs tailored to specific user needs, where such programs include a user interface and are capable of accessing and manipulating the data files. Generally, any EDA environment and compatible procedural language which have capabilities of the type noted may be used.

In a typical integrated circuit design program, a schematic for each cell is developed and converted to a layout. Upon completion of a layout design, the DRC verification process is executed. In accordance with the present invention, a subroutine (labelled 100 in the figure) is then executed to update the layout data file for the cell.

Subroutine 100 performs two primary functions: 1) it causes a property named "good DRC done", which indicates the date of the last good DRC run, to be appended (if it does not already exist) to the layout design data file; and 2) it queries the user as to whether the layout data file should have the "good DRC done" property updated with the current date and time. Thus, upon completion of a DRC verification run, subroutine 100 causes a dialog box to appear on the user's terminal which queries the user as to whether the cell's "good DRC done" property should be updated. This permits the user to examine the DRC verification results and determine if they contain any indications of false errors or other potential problems. The user is given the option of updating the property by responding "Yes" to the query, or not updating the property by responding "No" or "Cancel".

If the user is satisfied with the verification results, they would respond "Yes" and the subroutine would automatically update the "good DRC done" property of the layout data file with a data string consisting of the time and date of the completed DRC process. This would indicate a user-determined successful verification. If the designated cell's layout file contains references to related layout files representing a cell or cells contained within the designated cell, then the user will have the option of updating the layout file of the designated cell, or of updating the layout files of the designated cell and the related cells.

Upon completion of the execution of subroutine 100 (or concurrent with it), LVS verification 122 is carried out. As noted, this process verifies that the layout design correctly corresponds to the verified schematic design. Upon completion of a LVS verification run, and in accordance with the present invention, a subroutine (labelled 110 in the figure) is then executed to update the layout data file for the cell.

Subroutine 110 performs two primary functions: 1) it causes a property named "good LVS done" to be appended (if it does not already exist) to the layout design data file; and 2) it queries the user as to whether the layout data file should have the "good LVS done" property updated with the current date and time. Thus, upon completion of a LVS verification run, subroutine 110 causes a dialog box to appear on the user's terminal which queries the user as to whether the cell's "good LVS done" property should be updated. This permits the user to examine the LVS verification results and determine if they contain any indications of false errors or other potential problems. The user is given the option of updating the property by responding "Yes" to the query, or not updating the property by responding "No" or "Cancel".

If the user is satisfied with the verification results, they would respond "Yes" and the subroutine would automatically update the "good LVS done" property of the layout data file with a data string consisting of the time and date of the completed LVS process. This would indicate a user-determined successful verification. As mentioned with regard to the updating of the layout files after a DRC verification, if the designated cell's layout file contains references to related layout files representing a cell or cells contained within the designated cell, then the user will have the option of updating the layout file of the designated cell, or of updating the layout files of the designated cell and the related cells. Note that subroutines 100 and 110 are executed for each cell layout design.

Because the described subroutines allow the layout designer (or other user) to update the cell database files based on the customary criteria applied when manually evaluating whether a successful verification has occurred (a completed run with either no errors, false errors, or only non-critical errors), the present invention is more flexible and less prone to error than a routine which automatically marks a cell data file as passing a DRC or LVS procedure once a verification run is completed. This is because false verification run errors would not prevent the data files from being updated when the present invention is used. For example, a false verification run error could occur in a situation in which a pattern is to be allowed for test purposes, but does not meet design rules allowed for the rest of the chip. This might occur if the spacing between two metal lines was required to be at least 3 microns, but the test pattern were drawn to have a 2.5 micron spacing. This situation would produce a "false error" because the DRC program would check the layout to insure that all metal lines were at least 3 microns apart.

Similarly, an error missed by the DRC or LVS verification run would not cause the verification time data to be updated because the user would have the option of indicating that they did not want this to occur. Thus, the present invention combines the accuracy of user interpretation of verification results (in determining whether a successful verification has occurred) with a reduction in the manual labor normally required to tabulate the results.

Another form of the present invention is one in which instead of letting the user decide whether the DRC or LVS process is successful, an automated updating operation is performed to indicate a successful process. In this "no error" update operation, the "good DRC done" property is updated only if the output of the DRC process yields zero errors, and the "good LVS done" property is updated only if the output of the LVS process shows a match between the cell schematic and layout. Typically, the output of DRC and LVS programs is such that a successful conclusion of the process can easily be easily determined from a run file or output file. That information can then be used to update the "good DRC done" or "good LVS done" property (by noting the date/time of the successful verification procedure). This "no error" method of automatically updating the "good DRC done" and "good LVS done" properties is not as flexible as an update procedure based on user evaluation of the verification results which would allow a successful verification to be noted when the DRC run produces only false errors or the LVS run produces only non-critical element mis-matches.

It is also noted that the present invention can be used in the form of a data processing system which manages and processes either the DRC verification or the LVS verification data in the indicated manner. In such a situation, two data processing systems would be used in conjunction to perform both the DRC and LVS data management operations. If only one of the verification procedures was needed for a particular project, then only a data management system for that procedure would be needed.

Figure 4:
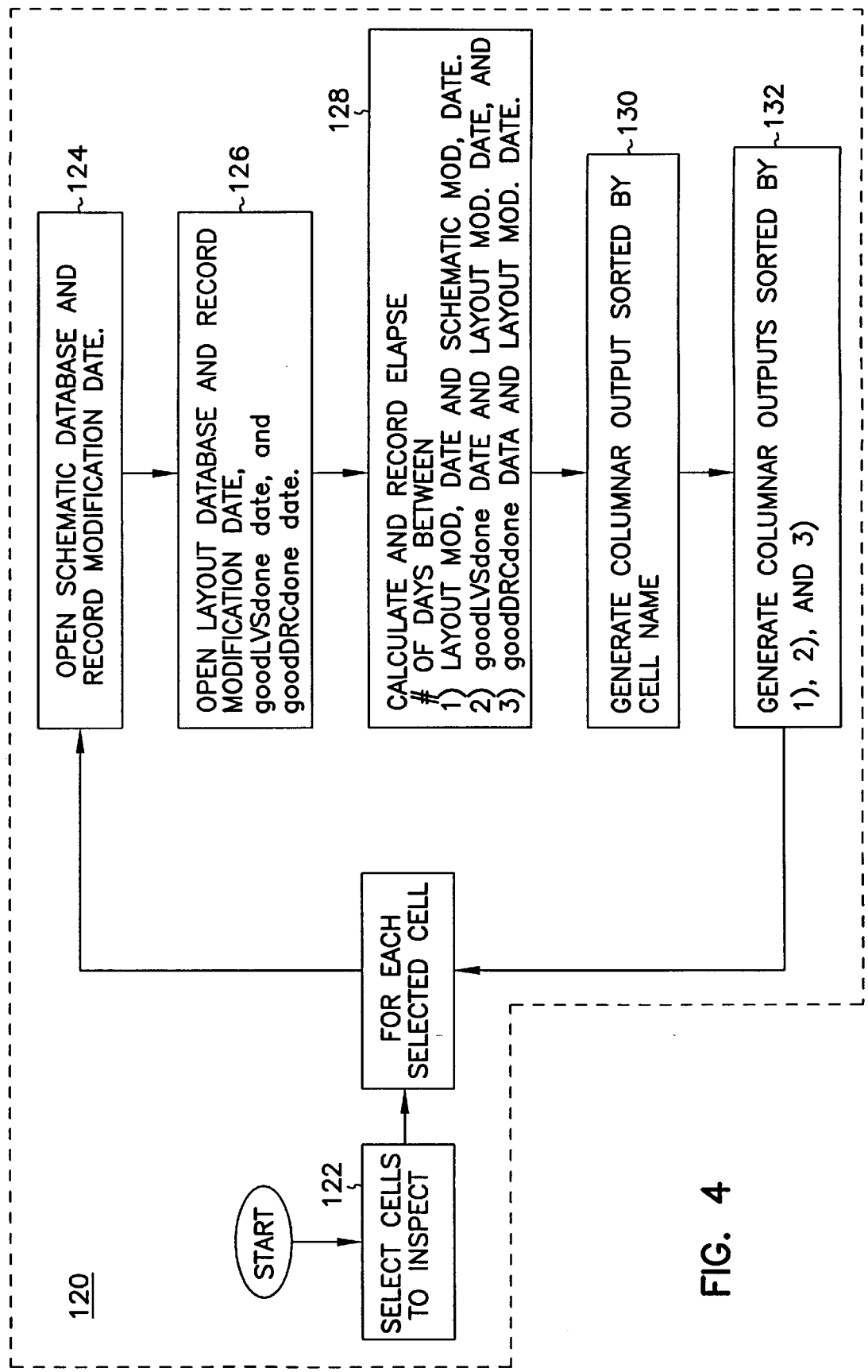
FIG. 4 is a flowchart showing the stages of the present invention which correspond to the data retrieval and analysis steps performed on data previously appended to the layout file of a cell.

A further aspect of the present invention is shown in FIG. 4, which is a flowchart showing the stages of the present invention which correspond to the data retrieval and analysis steps performed on data previously appended to the layout file of a cell. This aspect of the invention takes the form of a subroutine 120 which analyzes the "good DRC done" and "good LVS done" properties of a cell's or cells' layout design file(s) and generates a report for use in managing the development cycle of the integrated circuit design project.

At any point in the design cycle, the project manager or a layout designer can run subroutine 120 by accessing a menu selection. The user is then asked to select which cell or cells to inspect 122. For each selected cell, subroutine 120 then accesses the corresponding schematic design database file and records the last time and date at which the schematic was modified 124. Subroutine 120 then accesses the corresponding layout design database file and records the last time and date of a layout modification, the latest "good DRC done" time and date, and the latest "good LVS done" time and date 126.

Subroutine 120 then analyzes the recorded data to produce a report for use in managing the project. The subroutine then determines the amount of time (in seconds, minutes, hours, or days) between the following events (indicated as stage 128 in the figure):

1) the latest schematic modification and the latest layout modification;
2) the latest layout modification and the latest "good DRC done" update; and
3) the latest layout modification and the latest "good LVS done" update.

The subroutine then tabulates the data and generates a report (stage 130) showing each cell name, the schematic page number for that cell, the latest schematic and layout modification dates, the latest "good DRC done" date, the latest "good LVS done" date, and the information (items 1), 2), and 3) above) determined from stage 128, all sorted according to cell name. The subroutine is also capable of generating reports sorted according to the properties determined in stage 128 (stage 132), or according to date of modification or verification or another property of interest.

The reports to be generated are typically determined by the user when subroutine 120 is called. The reports are displayed on the user's terminal as well as being stored in a data file. By inspecting the time differences between the noted events, a layout designer or project manager can identify project priorities or obtain a quick "snapshot" of the status of the project.

If a schematic has a more recent date than a layout for a cell, it means that layout design changes may need to be done. At the least, a LVS process needs to be run to verify that the schematic and the layout still match. Similarly, if a schematic has a more recent date than the "good LVS done" property, then an LVS should be run.

If a layout has a more recent completion date than the "good DRC done" property, then a DRC process should be run on the cell. If a layout has a more recent completion date than the "good LVS done" property, then a LVS process should be run on the cell.

Thus, the report can be used to identify those cells where the schematics are more recent than the layout or verification dates. This can be done automatically through data comparisons performed by the program used to generate the report. This will tell the project manager how many cells need updates, giving them an indication of how much work still has to be done to complete the design process.

FIG. 5 illustrates the contents of the database (or databases) containing the schematic design and layout design data files, and the verification tracking data appended by the present invention. As indicated in the figure, each cell in the integrated circuit being designed has a corresponding schematic data file 200 and layout data file 210. Schematic file 200 contains graphical information 202 representing the schematic for the cell, and textual information 204 representing the modification and verification history of the schematic. Layout file 210 contains graphical information 212 representing the layout for the cell, and textual information 214 representing the modification and verification history of the layout, and the "good DRC done" and "good LVS done" data appended to the file by a user of the present invention. A collection of schematic data files 200 and layout data files 210 form the database 220 which is accessed by the present invention (and which is identified as element 12 of FIGS. 1 and 2). The schematic and layout data files may of course be contained in separate databases.

FIG. 6 is an example of a report generated by the integrated circuit layout verification data management apparatus of the present invention. The report shown in the figure is sorted according to cell name and indicates the date of the last schematic change, last layout change, last "good DRC done" update, and the last "good LVS done" update. The report also indicates those cells requiring an update of the layout, or the performance of a DRC or LVS process on the layout.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

We claim:

1. A computer readable medium having a computer program encoded therein, wherein the computer program is executed on a computer to perform a method of managing and analyzing data generated during the design of an integrated circuit or an electronic system, the method comprising:

constructing a database containing layout data files for a plurality of cells of the integrated circuit or system, the layout data file for each cell containing a time of the last modification of the layout for that cell;

designating a cell and its corresponding data files contained in the database;

performing a design rule verification process on a layout data file of the designated cell; and accessing the layout data file corresponding to the designated cell and modifying that file by appending a time of a successful completion of the design rule verification process to the layout data file.

2. The computer readable medium of claim 1 wherein the method further comprises:

accessing the modified layout data file corresponding to the designated cell and storing the time of the last modification of the layout and the appended time of successful completion of the design rule verification process in a storage device; and processing the stored data to output the time between the events corresponding to the stored data.

3. The computer readable medium of claim 2 wherein the method further comprises:

generating a report showing the results of processing the data.

4. The computer readable medium of claim 1 wherein the time of the successful completion of the design rule verification process is appended to the data file in response to a user command.

5. The computer readable medium of claim 1 wherein the time of the successful completion of the design rule verification process is automatically appended to the data file when no errors are found upon completion of the process.

6. A computer readable medium having a computer program encoded therein, wherein the computer program is executed on a computer to perform a method of managing and analyzing data generated during the design of an integrated circuit or an electronic system, the method comprising:

constructing a database containing schematic and layout data files for a plurality of cells of the integrated circuit or system, the schematic data file for each cell containing a time of the last modification of the schematic for that cell, and the layout data file for each cell containing a time of the last modification of the layout for that cell;

designating a cell and its corresponding data files contained in the database;

performing a layout versus schematic verification process on a layout data file and its corresponding schematic data file of the designated cell; and accessing the layout data file corresponding to the designated cell and modifying that file by appending a time of a successful completion of the layout versus schematic verification process to the layout data file.

7. The computer readable medium of claim 6 wherein the method further comprises:

accessing the schematic and modified layout data files corresponding to the designated cell and storing the time of the last modification of the schematic and layout and the appended time of successful completion of the layout versus schematic verification process in a storage device; and processing the stored data to output the time between the events corresponding to the stored data.

8. The computer readable medium of claim 7 wherein the method further comprises:

generating a report showing the results of processing the data.

9. The computer readable medium of claim 7 wherein the time of the successful completion of the layout versus schematic verification process is appended to the data file in response to a user command.

10. The computer readable medium of claim 7 wherein the time of the successful completion of the layout versus schematic verification process is automatically appended to the data file when no errors are found upon completion of the process.

11. A method of managing and analyzing data generated during the design of an integrated circuit memory device, comprising:

constructing a database containing schematic and layout data files for a plurality of cells of the memory device, the schematic data file for each cell contains a time of the last modification of the schematic for that cell, and the layout data file for each cell contains a time of the last modification of the layout for that cell;

designating a cell and its corresponding data files contained in the database;

performing a design rule verification process on a layout data file of the designated cell;

performing a layout versus schematic verification process on a layout data file and its corresponding schematic data file of the designated cell;

accessing the layout data file corresponding to the designated cell and modifying that file by appending a time of a successful completion of the design rule verification process and a successful completion of the layout versus schematic verification process to the layout data file;

accessing the schematic and modified layout data files corresponding to the designated cell and storing the time of the last modification of the schematic and layout and the appended times of successful completion of the design rule and layout versus schematic verification processes in a storage device;

processing the stored data to output the time between the events corresponding to the stored data; and generating a report showing the results of processing the data.

12. The method of claim 11 wherein the step of processing the stored data determines the time between the schematic modification data and the layout modification data.

13. The method of claim 11 wherein the step of processing the stored data determines the time between the layout modification date and the time of the successful completion of the design rule verification process.

14. The method of claim 11 wherein the step of processing the stored data determines the time between the layout modification data and the time of the successful completion of the layout versus schematic verification process.

15. The method of claim 11 wherein the step of generating a report generates a report showing the output times sorted according to a name of the cell.

16. The method of claim 11 wherein the step of appending the time of the successful completion of the design rule verification process and the successful completion of the layout versus schematic verification process to the layout data file is performed in response to a user command.

17. The method of claim 11 wherein the step of appending the time of the successful completion of the design rule verification process and the successful completion of the layout versus schematic verification process to the layout data file is performed automatically when no errors are found upon completion of the processes.

18. The method of claim 11 wherein the layout data file for the designated cell includes a reference to a layout data file for a second cell, and wherein the method further comprises:

accessing the layout file for the second file and modifying that file by appending a time of a successful completion of the design rule verification process and a successful completion of the layout versus schematic verification process to the layout data file for the second cell.

19. A data processing system for use in managing and analyzing data generated during a design of an integrated circuit memory device, the data processing system comprises:

a database containing schematic and layout data files for a plurality of cells of the integrated circuit memory device, the schematic data file for each cell containing a time of a last modification of the schematic for that cell and the layout data file for each cell containing a time of the last modification of the layout for that cell;

an input device for allowing a user to designate a cell and its corresponding data files contained in the database; and a processor for performing a design rule verification process on a layout data file of the designated cell, the processor also performs a layout versus schematic verification process on a layout data file and its corresponding schematic data file of the designated cell, the processor is capable of accessing the layout data file corresponding to the designated cell and modifying that file by appending a time of a successful completion of the design rule verification process and a successful completion of the layout versus schematic verification process to the layout data file.

20. The data processing system of claim 19 further comprising:

a second data processor capable of accessing the schematic and modified layout data files corresponding to the designated cell and storing the time of the last modification of the schematic and layout and the appended times of successful completion of the design rule and layout versus schematic verification process, and for processing the stored data to determine the time between the events corresponding to the stored data.

21. The data processing system of claim 20 further comprising:

a report generator for generating a report showing the results of processing the data.

22. The data processing system of claim 21 further comprising:

an output device for displaying the contents of the generated report to the user.

23. The data processing system of claim 21 wherein the report generator generates a report showing the output times sorted according to a name of the cell.

24. The data processing system of claim 20 wherein the second data processor processes the data to determine the time between the schematic modification data and the layout modification data.

25. The data processing system of claim 20 wherein the second data processor processes the data to determine the time between the layout modification data and the time of the successful completion of the design rule verification process.

26. The data processing system of claim 20 wherein the second data processor processes the data to determine the time between the layout modification data and the time of the successful completion of the layout versus schematic verification process.

27. The data processing system of claim 20 wherein the data processor appends the time of the successful completion of the design rule and layout versus schematic verification processes in response to a user command.

28. The data processing system of claim 20 wherein the data processor automatically appends the time of the successful completion of the design rule and layout versus schematic verification processes when no errors are found upon completion of the processes.

29. The data processing system of claim 20 wherein the layout data file for the designated cell includes a reference to a layout data file for a second cell, and further, wherein the data processor is capable of accessing the layout file for the second file and modifying that file by appending a time of a successful completion of the design rule verification process and a successful completion of the layout versus schematic verification process to the layout data file for the second cell.

30. A data processing system for use in managing and analyzing data generated during the design of an integrated circuit or an electronic system mounted on a printed circuit board, the data processing system comprises:

a database containing layout data files for a plurality of cells of the integrated circuit or system, the layout data file for each cell containing a time of the last modification of the layout for that cell;

an input device for allowing a user to designate a cell and its corresponding data files contained in the database; and a processor for performing a design rule verification process on a layout data file of the designated cell, the processor is also capable of accessing the layout data file corresponding to the designated cell and modifying that file by appending a time of a successful completion of the design rule verification process to the layout data file.

31. The data processing system of claim 30, further comprising:

a second data processor capable of accessing the modified layout data file corresponding to the designated cell and storing the time of the last modification of the layout and the appended time of successful completion of the design rule verification process, and for processing the stored data to determine the time between the events corresponding to the stored data.

32. A data processing system for use in managing and analyzing data generated during the design of an integrated circuit or an electronic system mounted on a printed circuit board, comprising:

a database containing schematic and layout data files for a plurality of cells of the integrated circuit or system, the schematic data file for each cell containing a time of the last modification of the schematic for that cell and the layout data file for each cell containing a time of the last modification of the layout for that cell;

an input device for allowing a user to designate a cell and its corresponding data files contained in the database; and a processor for performing a layout versus schematic verification process on a layout data file and its corresponding schematic data file of the designated cell, the processor further accesses the layout data file corresponding to the designated cell and modifying that file by appending a time of a successful completion of the layout versus schematic verification process to the layout data file.

* * * * *